(12) United States Patent
Laurent

(10) Patent No.: US 6,862,233 B2
(45) Date of Patent: Mar. 1, 2005

(54) METHOD AND CIRCUIT FOR DETERMINING SENSE AMPLIFIER SENSITIVITY

(75) Inventor: Duane Giles Laurent, Lewisville, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 10/657,617

(22) Filed: Sep. 8, 2003

(65) Prior Publication Data

US 2004/0052126 A1 Mar. 18, 2004

Related U.S. Application Data

(62) Division of application No. 10/147,626, filed on May 16, 2002, now Pat. No. 6,643,164, which is a division of application No. 09/752,568, filed on Dec. 28, 2000, now Pat. No. 6,418,044.

(51) Int. Cl.[7] .................................................. G11C 7/00
(52) U.S. Cl. ...................... 365/201; 365/205; 365/207; 365/190; 365/202; 365/196
(58) Field of Search ................................ 365/201, 205, 365/207, 190, 202, 196

(56) References Cited

U.S. PATENT DOCUMENTS

| | | | |
|---|---|---|---|
| 4,504,929 A | 3/1985 | Takemae et al. | |
| 5,010,524 A | 4/1991 | Fifield et al. | |
| 5,184,326 A | 2/1993 | Hoffmann et al. | |
| 5,305,261 A | * 4/1994 | Furutani et al. | ....... 365/189.01 |
| 5,361,232 A | 11/1994 | Petschauer et al. | |
| 5,381,364 A | 1/1995 | Chern et al. | |
| 5,418,750 A | 5/1995 | Shiratake et al. | |
| 5,428,574 A | 6/1995 | Kuo et al. | |
| 5,532,963 A | 7/1996 | Kushiyama et al. | |
| 5,880,988 A | 3/1999 | Bertin et al. | |
| 5,917,744 A | 6/1999 | Kirihata et al. | |
| 6,067,263 A | 5/2000 | Brady | |
| 6,088,286 A | * 7/2000 | Yamauchi et al. | ..... 365/230.06 |
| 6,097,650 A | 8/2000 | Brede et al. | |
| 6,104,650 A | 8/2000 | Shore | |
| 6,137,712 A | 10/2000 | Röhr et al. | |
| 6,236,607 B1 | 5/2001 | Schlager et al. | |
| 6,275,434 B1 | 8/2001 | Yamada et al. | |
| 6,339,550 B1 | 1/2002 | Wanlass | |
| 6,418,044 B1 | * 7/2002 | Laurent | ...................... 365/149 |
| 6,434,055 B2 | * 8/2002 | Tanaka et al. | ........... 365/185.3 |
| 6,480,435 B2 | * 11/2002 | Nakamura et al. | .......... 365/207 |
| 6,643,164 B2 | * 11/2003 | Laurent | ...................... 365/149 |
| 6,643,180 B2 | * 11/2003 | Ikehashi et al. | ........ 365/185.22 |
| 2004/0052126 A1 | * 3/2004 | Laurent | ...................... 365/200 |

* cited by examiner

Primary Examiner—Viet Q. Nguyen
(74) Attorney, Agent, or Firm—Lisa K. Jorgenson; Steven H. Slater

(57) ABSTRACT

A dynamic random access memory (DRAM) includes a bit line pair, including a first bit line and a second bit line. Memory cells and a sense amplifier are coupled to the bit lines. A first characterization cell is coupled between the first bit line and a first reference supply line. The first characterization cell includes a capacitor. Similarly, a second characterization cell is coupled between the first bit line and the first reference supply line. The second characterization cell also includes a capacitor but preferably with a different capacitance. In the preferred embodiment, similar characterization cells are coupled to the second bit line.

10 Claims, 4 Drawing Sheets

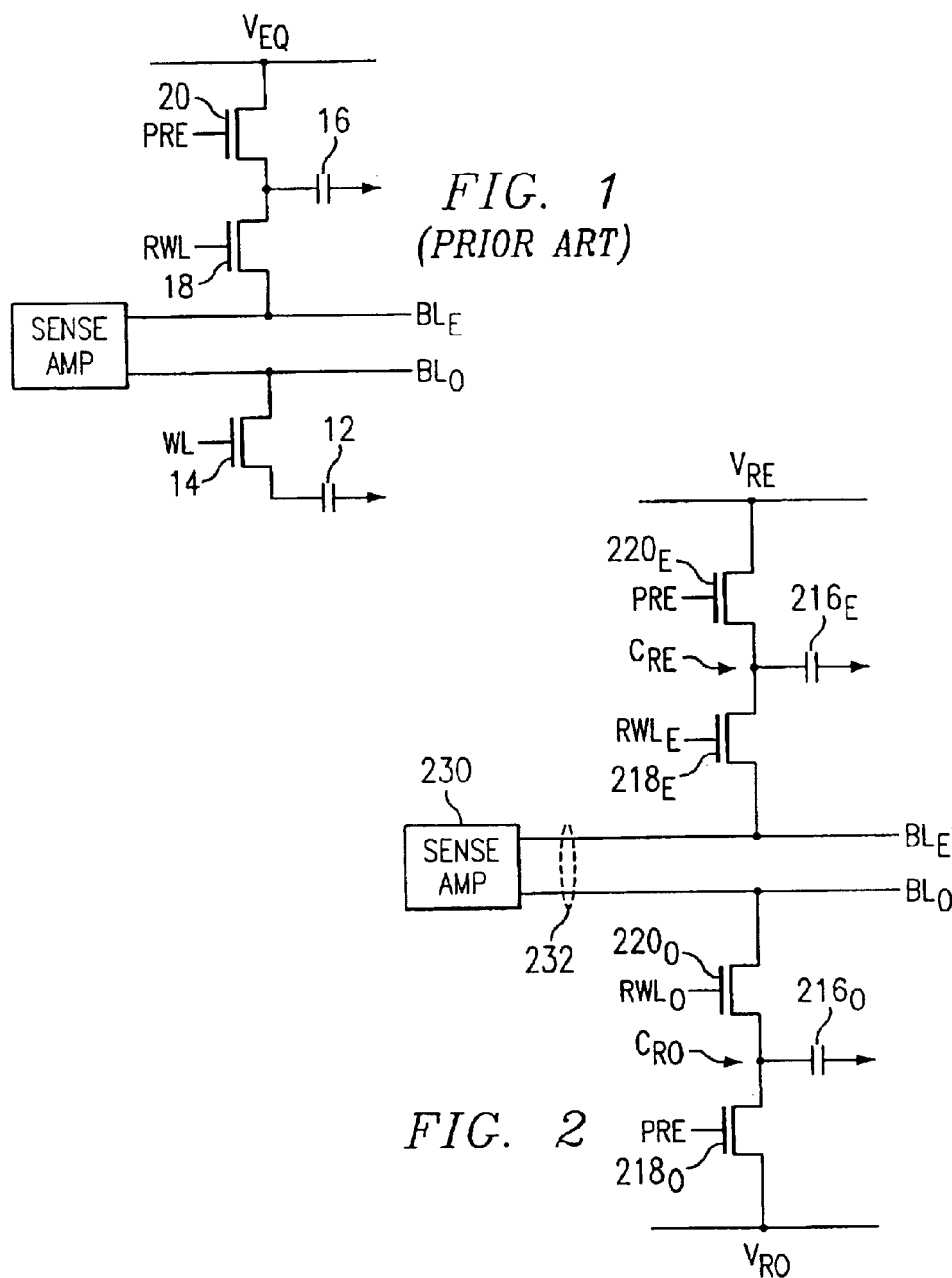
FIG. 1 (PRIOR ART)
FIG. 2
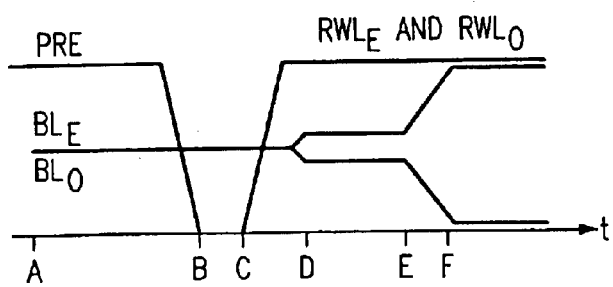
FIG. 3

METHOD AND CIRCUIT FOR DETERMINING SENSE AMPLIFIER SENSITIVITY

CROSS-REFERENCE TO RELATED APPLICATIONS

This invention is a divisional of Ser. No. 10/147,626 filed May 16, 2002, now U.S. Pat. No. 6,643,164, which is a divisional of Ser. No. 09/752,568, filed Dec. 28, 2000 now U.S. Pat. No. 6,418,044.

This invention is related to commonly-assigned U.S. Pat. No. 6,067,263 filed Apr. 7, 1999 and issued May 23, 2000. This patent is incorporated herein by reference.

FIELD OF THE INVENTION

This invention relates generally to memory devices and specifically to a method and circuit for determining sense amplifier sensitivity.

BACKGROUND OF THE INVENTION

Dynamic Random Access Memory (DRAM) is a commonly used type of memory device. A typical memory cell has a transistor and storage capacitor. The capacitor maintains the charge representing a bit of data for a short period of time. Since any real capacitor is going to be imperfect and will leak charge, the memory cell is periodically refreshed.

The DRAM also includes a sense amplifier for sensing a voltage differential that appears between a first bit line and second bit line during a read operation of the memory cell. The sense amplifier determines a binary value of the data represented by the charge maintained in the memory cell by comparing a voltage level corresponding to the charge of the memory cell that is transferred to the first bit line to that of a precharge voltage (e.g., Vdd/2) present on the second bit line. However, since the voltage level within the storage capacitor of the memory cell decays towards ground, the detection of a "high" binary value by the sense amplifier becomes more difficult as the voltage level within the storage capacitor decays closer to the precharge voltage.

In addressing the decaying problem of the storage capacitor, some DRAM circuits use a reference cell to aid the sense amplifier in detecting the "high" binary values by setting a reference voltage within the reference cell to a level below the conventional precharged voltage of Vdd/2 and comparing the reference voltage instead of the conventional precharge voltage to the voltage level of the memory cell. The utilization of the reference voltage set below the traditional precharge voltage increases the margin for detecting the "high" binary value of the memory cell, at the expense of a corresponding decrease in the margin for detecting a "low" binary value of the memory cell.

An example of a circuit that uses a reference cell is shown in FIG. 1. As shown in FIG. 1, the memory cell includes storage capacitor 12 and pass transistor 14. The pass transistor is controlled by a word line signal WL. The reference cell includes capacitor 16 and pass transistor 18, which is controlled by reference word line signal RWL. A pass transistor 20 is coupled between the storage node of the reference cell and reference voltage Veq. Transistor 20 is controlled by precharge signal PRE.

In the DRAM of FIG. 1, the precharge signal PRE keeps the system stable until a row access begins. Simultaneously, the normal and reference word lines WL and RWL are kept off. As a row access begins, the precharge signal is removed and then one word line signal WL and the reference world line signal RWL on the opposite bit line are asserted.

Unfortunately, the current use of the reference cell to increase the margin for detecting the "high" binary value within the memory cell fails to address a problem where the sense amplifier itself may be defective. For instance, the sense amplifier may not have sufficient sensitivity to correctly identify the binary value or voltage level of the memory cell regardless of the setting of the margins.

SUMMARY OF THE INVENTION

As power supply voltages drop, the difficulty of designing analog CMOS circuits increases. With supplies below the traditional CMOS switching value ($V_{TN}+V_{TP}$), characterization of these circuits becomes critical. In DRAMs, the most sensitive analog circuits are the sense amplifiers which convert small bit line voltages into usable, rail-to-rail outputs. When DRAMs are embedded in an ASIC chip, the problem is compounded by the limited access from the outside. Thus, some internal means of performing sense amplifier characterization is desired.

In one aspect, the present invention provides just such a method. For example, in a first embodiment a dynamic random access memory (DRAM) includes a bit line pair, including a first bit line and a second bit line. Memory cells and a sense amplifier are coupled to the bit lines. A first characterization cell is coupled between the first bit line and a first reference supply line. The first characterization cell includes a capacitor. Similarly, a second characterization cell is coupled between the first bit line and the first reference supply line. The second characterization cell also includes a capacitor, possibly with a different capacitance. In the preferred embodiment, similar characterization cells are coupled to the other bit line.

In another embodiment, the memory device includes an odd and an even reference supply line. For each even bit line in the device, at least one characterization cell is coupled between the even reference supply line and that particular even bit line. Similarly, for each odd bit line, at least one characterization cell is coupled between the odd reference supply line and that particular odd bit line. During a test mode, the even (and/or the odd) reference supply line is characterized by having a distributed resistance along the line.

BRIEF DESCRIPTION OF THE DRAWINGS

The above features of the present invention will be more clearly understood from consideration of the following descriptions in connection with accompanying drawings in which:

FIG. 1 is schematic diagram of a known memory device;

FIG. 2 is a schematic diagram of a memory device as disclosed in a related patent;

FIG. 3 is a timing diagram of the device of FIG. 2;

DETAILED DESCRIPTION OF ILLUSTRATIVE EMBODIMENTS

Figure 4:
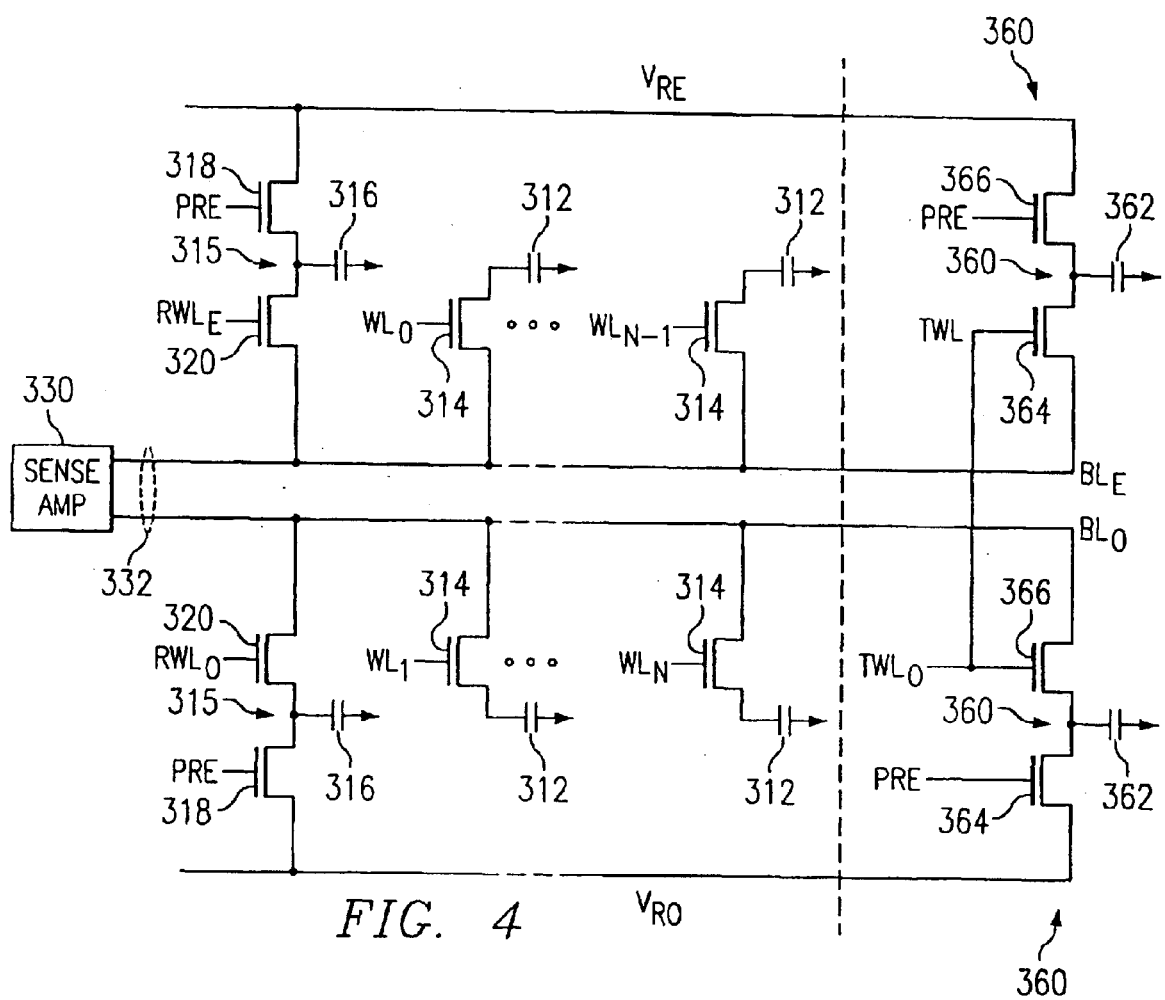
FIG. 4 is a schematic diagram of a memory device of the present invention.

The making and use of the various embodiments are discussed below in detail. However, it should be appreciated that the present invention provides many applicable inventive concepts which can be embodied in a wide variety of specific contexts. The specific embodiments discussed are merely illustrative of specific ways to make and use the invention, and do not limit the scope of the invention.

Although the DRAM circuits of the present invention will be described without reference to any particular semiconductor chips, it should be understood that the present invention can be used within stand-alone memory chips but is especially suited for use as memory embedded within an integrated circuit such as a microprocessor chip or an application specific integrated circuit (ASIC). Accordingly, the DRAM circuit described should not be construed in a limited manner.

In one aspect, the present invention relates to the characterization of sense amplifiers for use with dynamic random access memories (DRAMs). U.S. Pat. No. 6,067,263 (hereinafter "the '263 patent") discloses one such method. After a brief description of the circuit taught in that patent, the present invention will be described with reference to particular examples.

FIG. 2 shows a characterization system that is similar to the one taught in the '263 patent. In FIG. 2, a sense amplifier 230 is coupled to a bit line pair 232. Bit line pair includes two bit lines $BL_E$ and $BL_O$. Each bit line is coupled to a plurality of memory cells (not shown). Each bit line $BL_E$ ($BL_O$) also includes a reference cell $C_{RE}$ ($C_{RO}$), which includes a storage capacitor $216_E$ ($216_O$), a pass transistor $218_E$ ($218_O$) coupled between the storage capacitor $216_E$ ($216_O$) and the bit line, and a pass transistor $220_E$ ($220_O$) coupled between the storage capacitor $216_E$ ($216_O$) and the reference supply line $V_{RE}$ ($V_{RO}$).

In this system, the precharge supply is spit into even and odd reference supply lines or column supplies, labeled $V_{RE}$ and $V_{RO}$ in FIG. 2. Using two separate reference supply lines $V_{RE}$ and $V_{RO}$ allows the even-and odd reference cells ($C_{RE}$ and $C_{RO}$) to be precharged to different values. During the row access cycle, the normal word line (not shown, see e.g., FIG. 1) remains off and both reference word lines $RWL_E$ and $RWL_O$ are used instead.

FIG. 3 illustrates a timing diagram of the operation of the circuit of FIG. 2. At time A, precharge signal PRE high and the reference word line signals $RWL_E$ and $RWL_O$ low. Accordingly, the storage node of capacitors $216_E$ and $216_O$ will be charged to the respective reference supply voltages $V_{RE}$ or $V_{RO}$. As the cycle begins, precharge signal PRE goes low at time B and the reference word lines $RWL_E$ and $RWL_O$ are turned on at time C. As charge flows between the cells $C_{RE}$ and $C_{RO}$ and their respective bit lines $BL_E$ and $BL_O$, the bit lines will separate slightly. This voltage separation is shown at time D. Once the sense amplifier 230 is activated at time E, the difference increases so that it can be read out at time F.

Since reference voltages $V_{RE}$ and $V_{RO}$ are known, the actual bit line splitting $\Delta V$ (i.e., the difference in the voltage on bit line $BL_E$ and the voltage on bit line $BL_O$) can be computed from the capacitances of the reference cell $C_c$ and the bit line $C_{BL}$ as follows:

$$\Delta V = \frac{C_C}{C_C + C_{BL}}(V_{RE} - V_{RO})$$

A large value of $\Delta V$ will produce an output that is constant (either '1' or '0', depending on the sign of $V_{RE}-V_{RO}$) across the matrix. But, as the voltage difference $\Delta V$ is decreased, a point will eventually be found where some columns begin to produce different (incorrect) values, indicating that the sensing limits of the system have been reached.

Unfortunately, two problems exist with this method: (1) the bit line capacitance $C_{BL}$ is not generally well characterized, thus the actual bit line differential is unknown; and (2) a large number of measurements are needed to reach a desired accuracy.

The present invention provides circuitry and test methods that can help to overcome these problems. In one aspect, the goal is to get a known splitting across the lines. This can be accomplished by either changing the reference voltages ($V_{RE}$ and/or $V_{RO}$) and/or changing the reference capacitance $C_C$. The following examples provide embodiments that utilize these principles.

In one embodiment, rather than using the references cells for characterization, copies of these cells can be created and moved, along with the split reference supply lines to some convenient place along the bit lines. These additional cells can be referred to as characterization cells. An example of this concept is shown in FIG. 4.

Similar to the embodiment of FIG. 2, the circuit of FIG. 4 includes a bit line pair 332 coupled to a sense amplifier 330. The bit line pair 332 includes an even bit line $BL_E$ and an odd bit line $BL_O$. Throughout this patent, the designation of which bit line is the even one and which is the odd is completely arbitrary. These labels are simply used to distinguish between the two bit lines in the pair. Although only one bit line pair 332 is illustrated, it should be understood that a large number (e.g., 512 or 1024 or more) of bit lines are included in a typical memory array.

Figure 5:
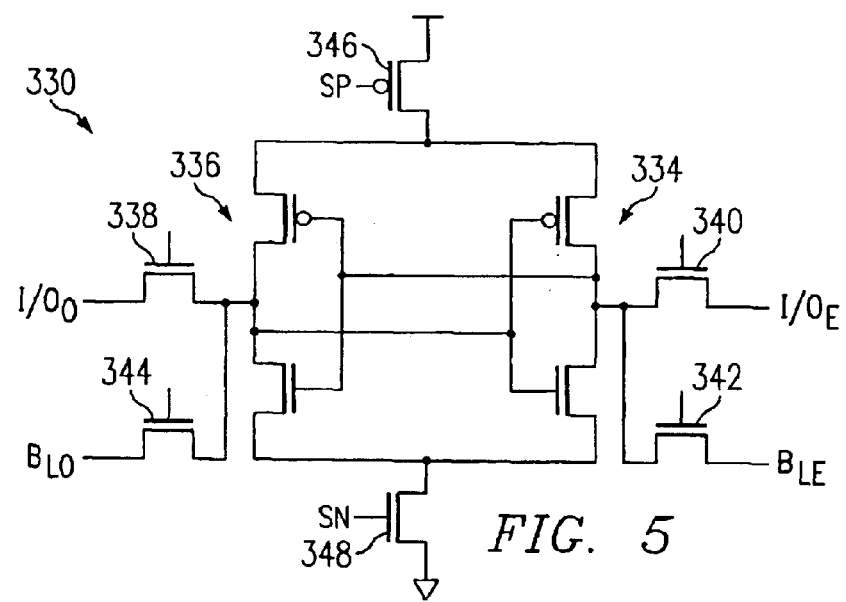
FIG. 5 is a sense amplifier that can be used with the present invention.

An example of a sense amplifier 330 is shown in FIG. 5. The sense amplifier 330 includes cross-coupled inverters 334 and 336 that operate to sense a small change in potential or the voltage differential appearing between the first bit line $BL_E$ and the second bit line $BL_O$. In response to sensing the voltage differential, the sense amplifier 330 drives the pair of bit lines to different voltage levels based on the sensed voltage differential. Input/output signals $I/O_E$ and $I/O_O$ (alternatively one I/O signal is permissible) corresponding to the different voltage levels present on the bit line pair 332 are then read from input/output lines by enabling an I/O control line to actuate output transistors 338 and 340, respectively.

The sense amplifier 330 may also be connected to the even bit line $BL_E$ by way of a first pass gate 342, and connected to the odd bit line $BL_O$ by way of a second pass gate 344. The first and second pass gates 342 and 344 (e.g., transmission gates) function to help facilitate the sensing and driving operation of the sense amplifier 102 by passing the voltage differential present on the bit lines 129 to the sense amplifier 102. Enable transistors 346 and 348 activate the sense amplifier 330 by connecting the power supplies at the appropriate time, as initiated by control signals SN and SP.

A number of memory cells are coupled to each bit line. As shown in FIG. 4, for a DRAM each memory cell includes a pass transistor 314 and a storage capacitor 312. In typical cases, a large number of memory cells are coupled to each bit line. For example, each bit line might have 128, 256 or more memory cells.

The circuit of FIG. 4 also includes a number of reference cells 315. Each reference cell 315 is coupled between one of the bit lines $BL_E$ or $BL_O$ and one of the reference supply lines $V_{RE}$ or $V_{RO}$. In this embodiment, each reference cell includes a capacitor 316, a first switch (e.g., a MOS transistor) 318 coupled between the capacitor 316 and the bit line $BL_E$ or $BL_O$, and a second switch (e.g., MOS transistor) coupled between the capacitor 316 and the reference supply line $V_{RE}$ or $V_{RO}$.

The circuit of FIG. 4 additionally includes a number of characterization cells 360. Each characterization cell 360 is coupled between one of the bit lines $BL_E$ or $BL_O$ and one of the reference supply lines $V_{RE}$ or $V_{RO}$ in the same manner as the reference cells. As shown, capacitor 362 is coupled to the respective bit line through switch 364 and also coupled to the respective reference supply line through switch 366. However, instead of being accessed by a reference word line (RWL), the characterization cells 360 are accessed by separate test word lines TWL. While this embodiment uses a characterization cell capacitor 362 that is identical to the capacitor 316 in the reference cell, it is understood that other sizes (e.g., integral multiples) of capacitors are allowed in the characterization cells without deviating from the presently claimed invention.

As with the previous method, a large difference in the reference supply voltages $V_{RE}-V_{RO}$ will produce consistent values for any selection of capacitor value $C_1$. As the difference is reduced, a voltage $V_1$ will be found which introduces inconsistencies from column to column. If the test is then repeated with a different capacitance $C_2$, a different voltage $V_2$ will be found to produce the same inconsistencies. From these values, the bit line capacitance can be computed as:

$$C_{BL} = \frac{C_1 - \left(\frac{V_2}{V_1}\right)C_2}{\frac{V_2}{V_1} - 1}$$

The second capacitance can be derived in a number of ways. For example, more than one characterization cell 360 can be coupled to each bit line $BL_E$ or $BL_O$. This additional characterization cell(s) could have a different capacitance than the other cell. Alternatively, or in addition, the two cells could be activated simultaneously to derive the second capacitance $C_2$. The characterization capacitance can also be varied by using a reference cell as a characterization cell. One way to accomplish this result is to vary the capacitance between the reference cell capacitor 316 and the characterization cell capacitor 362. In the first test, the characterization cell 360 would be used and in the second test the reference cell 315 (acting as a second characterization cell) would be used, or vice versa. Another way would be to use one of the cells during the first test and both of the cells in parallel in the second test. Either of these alternatives would create different capacitance values $C_1$ and $C_2$, which could in turn be used to calculate the bit line capacitance $C_{BL}$.

Once bit line capacitance $C_{BL}$ is known, the actual bit line splitting $\Delta V$ can be computed from the applied voltage. Additional capacitance values may be used to increase the accuracy of the results. Because the test is run simultaneously across the matrix, the effects of weak cells can be easily eliminated without corrupting the data.

The above ideas do not necessarily adequately resolve the second problem mentioned above since the tests described above can still be time-consuming. To reduce this time, the supply lines used for characterization can be modified to have left-side ($V_{REL}$ and $V_{ROL}$) and right side ($V_{RER}$ and $V_{ROR}$) connections. This technique can significantly reduce test time.

Figure 6:
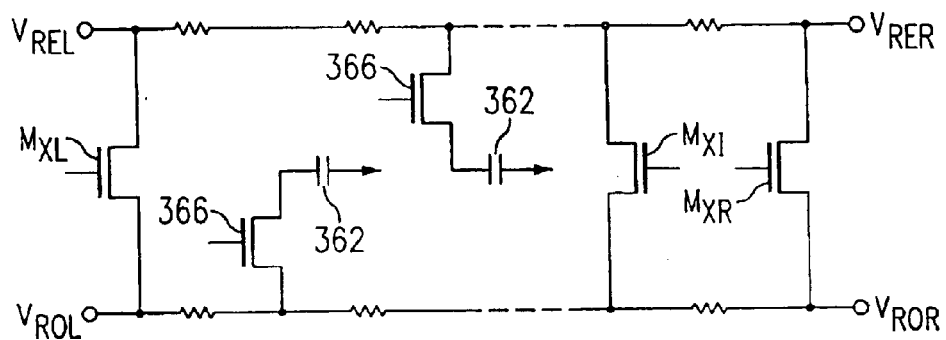
FIG. 6 illustrates a second embodiment of the present invention.
Figure 7:
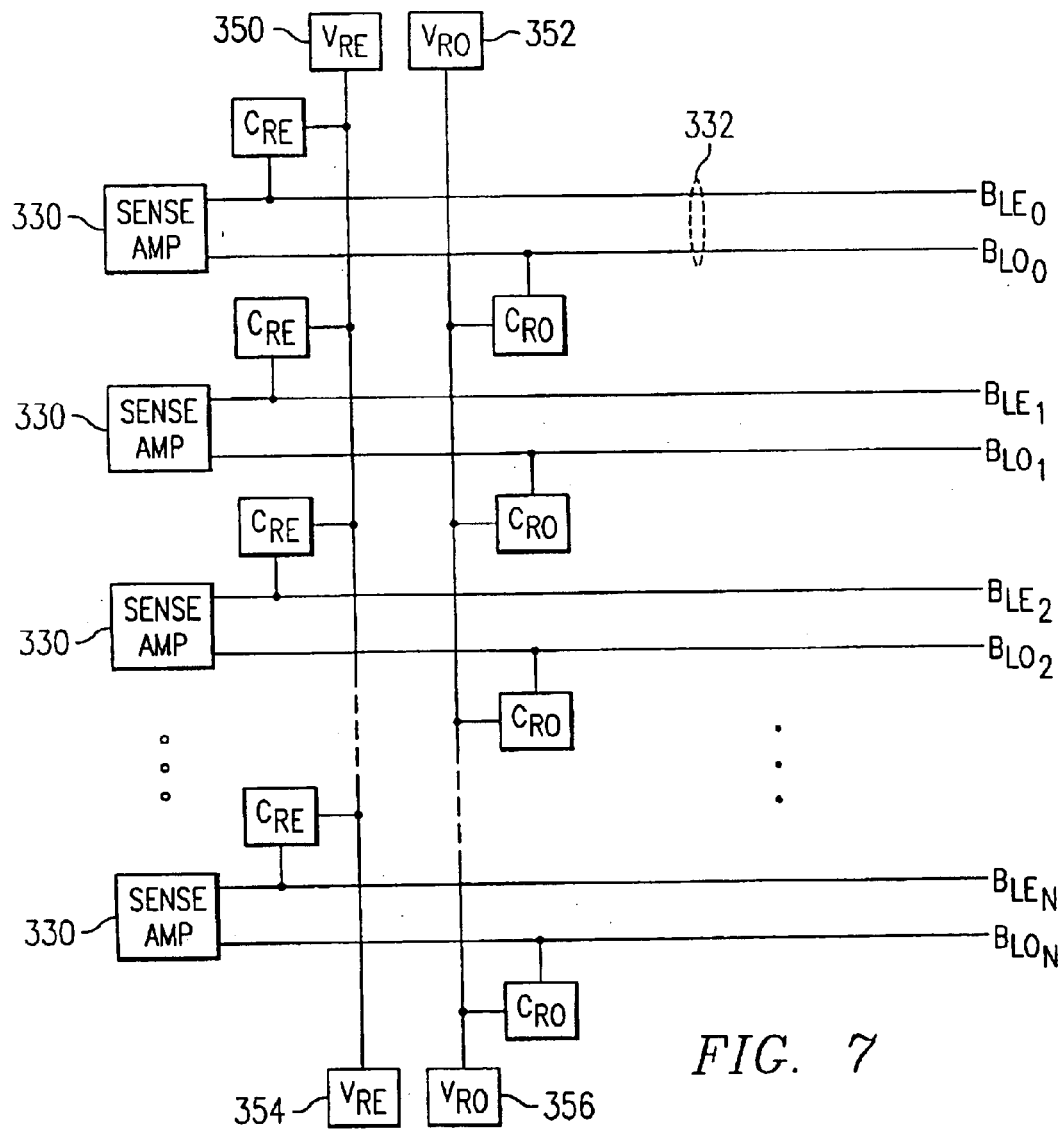
FIG. 7 is a block diagram of an embodiment of the present invention.

FIGS. 6 and 7 illustrate circuitry that uses this technique. As shown in FIG. 7, the reference supply lines $V_{RE}$ and $V_{RO}$ extend across a number of bit line pairs 332. Each bit line $BL_{Ea}$ and $BL_{Oa}$ ('a' varying from 0 to n, where n is the number of bit line pairs) is coupled to one of the reference supply lines $V_{RE}$ or $V_{RO}$ through a dummy cell $C_{RE}$ or $C_{RO}$. For the purposes of testing the device, the voltage applied to the reference supply lines $V_{RE}$ or $V_{RO}$ is a function of the physical location along that reference supply line.

In the example of FIG. 6, each of the reference supply lines $V_{RE}$ and $V_{RO}$ has a distributed resistance. In this manner, one of the ends, e.g., $V_{REL}$, is coupled to a first voltage and the other end, e.g., $V_{RER}$, is coupled to a second voltage, the voltage along the even reference line $V_{RE}$ will vary linearly from the first voltage to the second voltage, so long as the resistance along the line is constant. Non-linear voltage gradients can be generated by varying the resistance along the line.

This configuration allows different voltages to be applied to each column (bit line pair) via the voltage gradient created by the distributed resistance across the array. Since the capacitor within each dummy cell $C_{RE}$ or $C_{RO}$ is charged to a different but deterministic voltage, a single row access cycle can give as much information as several hundred cycles run in the method described with respect to FIG. 2.

As shown in FIG. 7, the test voltage can be applied to the reference supply lines $V_{RE}$ and $V_{RO}$ using test pads 350–356. These pads 350–356 are particularly useful when the device is going to be tested before being packaged, for example, using a test probes. Test pads 350–356 have been illustrated as being located at each end of the reference supply lines. While this location is convenient, the present invention envisions other locations as well. It is also understood that more or fewer than four test pads can be included.

FIG. 6 includes switches $M_X$ coupled between the two reference supply lines $V_{RE}$ and $V_{RO}$. The switches $M_X$ preferably comprise wide (low-resistance) MOSFETs. Switches $M_{XL}$ and $M_{XR}$ at each end of the lines and/or switches (e.g., $M_{X1}$) at select points along the lines permit additional flexibility by creating different gradients or by moving the zero-differential point to alternate spots along the lines (e.g., to test for positional variations of sensitivity).

As discussed above, various embodiments could use the reference cells in tandem with the characterization cells. There is no need to keep these functions separate. It might only affect the die area different.

Figure 8A:
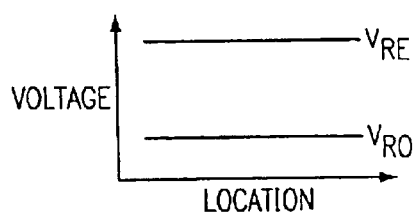
FIGS. 8a–8e show various relationships between test voltage and location along the reference lines.
Figure 8B:
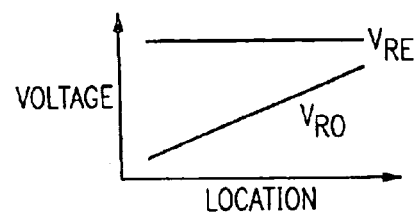
Figure 8C:
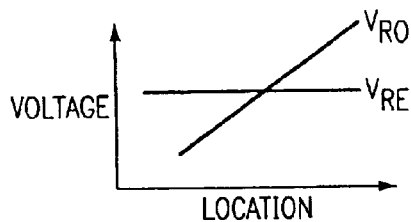
Figure 8D:
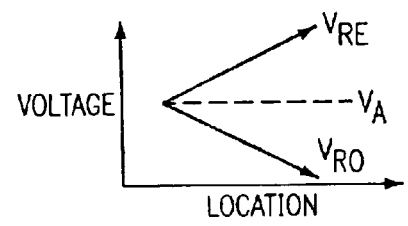
Figure 8E:
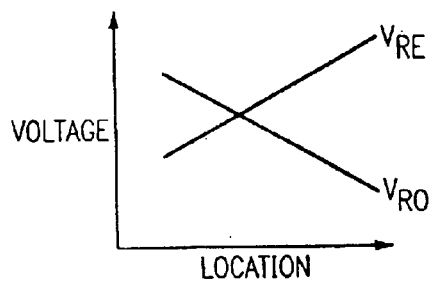
Figure 9:
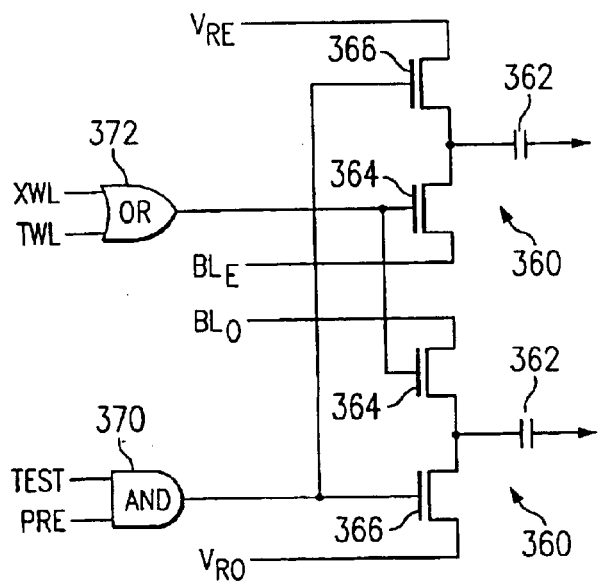
FIG. 9 illustrates another embodiment of the present invention.

FIGS. 8a–8e show examples of some of the voltage distributions that can be used with this technique. Each distribution is shown as a voltage as a function of the physical location along the supply line. In FIGS. 8a, 8b and 8c, the even test voltage is constant. (As noted above, the choice of which bit line is even and which is odd is arbitrary.) In FIG. 8b and 8c, the odd test voltage varies linearly across the odd reference voltage line. In FIGS. 8d and 8e, both of the test voltages vary linearly across their respective reference supply lines. The case shown in FIG. 8 can be obtained with intermediate shorting FETs, for example like transistor $M_{X1}$ shown in FIG. 6.

Other voltage distributions can also be used. For example, mirror images (e.g., left to right) and $V_{RE}$ and $V_{RO}$ swaps (e.g., symmetric) as well as the case where $V_{RE}=V_{RO}=$ constant. It is noted that the use of a shorting FET on either end, e.g., as shown in FIG. 8d, permits automatic generation of the average voltage value $V_A=\frac{1}{2}(V_{RE}+V_{RO})$. As noted above, non-linear relationships can be obtained by changing the resistance as a function of location along the reference supply line.

The main challenges to a successful implementation of this idea are the overhead of the new capacitive references and the linearity and accuracy of the resistor ladder. The layout of the capacitive reference should preferably be consistent with the remainder of the memory matrix and the number of components added to the bit lines should be kept small to minimize any interference with normal bit line operation. The layout and composition of the resistive regions should be consistent with the matrix and the total resistance of the $V_{RE}$–$V_{RO}$ lines should large enough to keep the current consumption low and to avoid local temperature variations. Also, additional space will be needed for the extra capacitors, MOSFETs, word lines and control signals as well as pins for the supply connections outside of the ASIC.

The present invention can be used for a variety of purposes. For example, testing can be performed to locate non-operational columns and to locate columns that are less sensitive. Sub-par columns can then be replaced with redundant columns. As another example, the present invention can be used to estimate the sensitivity of sense amplifiers within the memory device. For instance, the testing can provide information to set a realistic value for the constraint in the uncertainty in the threshold voltage of the transistors in the sense amplifier. This uncertainty is inversely proportional to the square root of the area of the transistor. Information of the uncertainty can be used in the design of transistor circuits.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of testing a memory device that includes a plurality of bit line pairs, each pair including an even bit line coupled to an even reference supply line by a test cell and an odd bit line coupled to an odd reference supply line by a test cell, the memory device further including a plurality of sense amplifiers, each sense amplifier coupled to a respective one of the bit line pairs, the method comprising:

generating an even test voltage on the even reference supply line, the even test voltage being a function of physical location along the even reference supply line;

generating an odd test voltage on the odd reference supply line; the odd test voltage being a function of physical location and along the odd reference line; and testing at least one of the sense amplifiers using at least one test cell coupled to the even reference supply line and at least one test cell coupled to the odd reference supply line.

2. The method of claim 1 wherein the even test voltage is constant along the even reference supply line.

3. The method of claim 2 wherein the odd test voltage is constant along the odd reference supply line.

4. The method of claim 2 wherein the odd test voltage is a linear function of physical location along the odd reference supply line.

5. The method of claim 4 wherein the odd test voltage has the same value as the even test voltage at a location along the odd reference voltage line.

6. The method of claim 5 wherein the location along the odd reference voltage line is one end of the odd reference voltage line.

7. The method of claim 1 wherein the even test voltage is a linear function of physical location along the even reference supply line and the odd test voltage is linear function of physical location along the odd reference supply line.

8. The method of claim 7 wherein the even test voltage has the same value as the odd test voltage at a location adjacent to a particular one of the bit line pairs.

9. The method of claim 8 wherein the particular one of the bit line pairs comprises a bit line pair at one end of the reference supply lines.

10. The method of claim 1 wherein the method comprises applying different voltages to each column and using a single row access to provide test information.

* * * * *